United States Patent [19]
Thelen, Jr.

[11] Patent Number: 5,231,315
[45] Date of Patent: Jul. 27, 1993

[54] TEMPERATURE COMPENSATED CMOS VOLTAGE TO CURRENT CONVERTER

[75] Inventor: Donald C. Thelen, Jr., Pullman, Wash.

[73] Assignee: Lattice Semiconductor Corporation, Hillsboro, Oreg.

[21] Appl. No.: 785,443

[22] Filed: Oct. 29, 1991

[51] Int. Cl.$^5$ ............................................. G06G 7/10
[52] U.S. Cl. .................................... 307/491; 307/310; 307/202.1
[58] Field of Search ............ 307/310, 491, 494, 296.6, 307/296.8, 202.1

[56] References Cited

U.S. PATENT DOCUMENTS

| | | | |
|---|---|---|---|
| 3,705,316 | 12/1972 | Burrous et al. | 307/310 |
| 3,980,963 | 9/1976 | Doi | 307/310 |
| 4,004,462 | 1/1977 | Dobkin | 307/310 |
| 4,582,659 | 4/1986 | Hilgers | 264/61 |
| 4,730,128 | 3/1988 | Seki | 307/310 |

Primary Examiner—William L. Sikes
Assistant Examiner—Toan Tran
Attorney, Agent, or Firm—Skjerven, Morrill, Macpherson, Franklin & Friel

[57] ABSTRACT

A voltage to current converter circuit is provided which outputs a constant current independent of temperature. The temperature coefficient of a first onchip impedance network is canceled by a threshold voltage of a transistor which has a temperature coefficient that tracks the temperature coefficient of the first impedance network. The magnitude of the output current is adjustable using the first impedance network, and does not affect the temperature coefficient. A second impedance network effectively zeros out the temperature coefficient of the circuit by adjusting an input reference voltage assumed to be constant. Furthermore, the present invention uses no bipolar transistors or diodes.

48 Claims, 3 Drawing Sheets

TEMPERATURE COMPENSATED CMOS VOLTAGE TO CURRENT CONVERTER

FIELD OF THE INVENTION

The present invention relates to a CMOS voltage to current convertor and, in particular, to a circuit which outputs a fixed current independent of temperature, voltage, and process, and which also is tunable.

BACKGROUND OF THE INVENTION

Voltage to current converters which compensate for a temperature coefficient are well known in the art. For example, referring to FIG. 1, one version of a voltage to current converter (hereinafter circuit 10), described in *Analysis and Design of Analog Integrated Circuits*, 2nd Edition, by P. R. Grey and R. E. Meyer, (1977, 1980), has a reference voltage $V_{REF}$ applied to line 1 which is coupled to the positive input terminal of operational amplifier 2. The output line 3 of operational amplifier 2 is connected to the gate G of N-channel transistor 9. Feedback loop 6 couples the source S of transistor 9 to the negative input terminal of operational amplifier 2. Source S is also coupled to resistor R which is grounded. The output current $I_{OUT}$ is provided on line 5 which is coupled to the drain D of transistor 9. Voltage to current conversion is accomplished by maintaining reference voltage $V_{REF}$ across resistor R using operational amplifier 2. By definition, the voltage $V_{REF}$ on line 1, connected to the positive input of operational amplifier 2, will also appear at node 8. Circuit 10 will be independent of temperature only if resistor R and reference voltage $V_{REF}$ have the same temperature coefficient, i.e. are affected by temperature in a similar manner. Since, on silicon, the best resistor available has a temperature coefficient of approximately 0.1% per degree Celsius, it follows that $V_{ref}$ must have a similar temperature coefficient. In addition to the temperature coefficient, the value of resistor R and reference voltage $V_{REF}$ are also typically dependent on processing.

To compensate for the temperature coefficient of resistor R, voltage $V_{REF}$ must exhibit a temperature coefficient equal to that of resistor R. One way of achieving a variable reference voltage $V_{REF}$ which would compensate for the temperature coefficient of resistor R is through the use of a band-gap voltage reference circuit (not shown) connected to line 1. Band-gap voltage reference circuits require the use of bipolar transistors. However, in CMOS processing, bipolar transistors pose several disadvantages. First, CMOS processing typically provides "parasitic" (i.e. non-dedicated) bipolar devices, but their use requires an undesirable substrate current. Second, dedicated bipolar transistors require special processing which increases manufacturing cost and complexity.

Therefore, a need arises for a voltage to current converter which compensates for a temperature coefficient, and which can be implemented in full CMOS processing (i.e. without bipolar transistors).

SUMMARY OF THE INVENTION

In accordance with the present invention, a voltage to current converter is provided which outputs a current independent of temperature and process. Furthermore, this converter can be used with an external voltage source, i.e. a source with no dependence on temperature. Voltage to current conversion is accomplished by maintaining a reference voltage, assumed to be independent of operating supply voltage and temperature, across an impedance network using an operational amplifier. Programmable taps in the impedance network tune the magnitude of the resistance (in the impedance network) to account for processing variations in the absolute value of this impedance. In one embodiment, electrically erasable programmable read only memory cells (EEPROM cells) are used as the programmable elements to control switches.

A transistor is coupled between the operational amplifier and the impedance network to compensate for the temperature coefficient of the impedance network. In one embodiment, a P-channel transistor effectively cancels the positive temperature coefficient of the impedance network. In this manner, the magnitude of the output current is adjustable, and does not affect the temperature coefficient. To tune the temperature coefficient to zero, the magnitude of the reference voltage is adjusted using a second impedance network.

DETAILED DESCRIPTION OF THE DRAWINGS

In accordance with the present invention, a reference voltage $V_{REF}$ is, for all practical purposes, assumed to be independent of both a voltage supply and temperature. However, reference voltage $V_{REF}$ may vary with process. For additional information regarding maintaining this reference voltage, reference is made to copending U.S. patent application Ser. No. 07/785,442, filed Oct. 29, 1991, entitled "Tunable Voltage Reference Circuit To Provide An Output Voltage With A Predetermined Temperature Coefficient Independent Of Variation In Supply Voltage", which is incorporated herein by reference.

Figure 2:
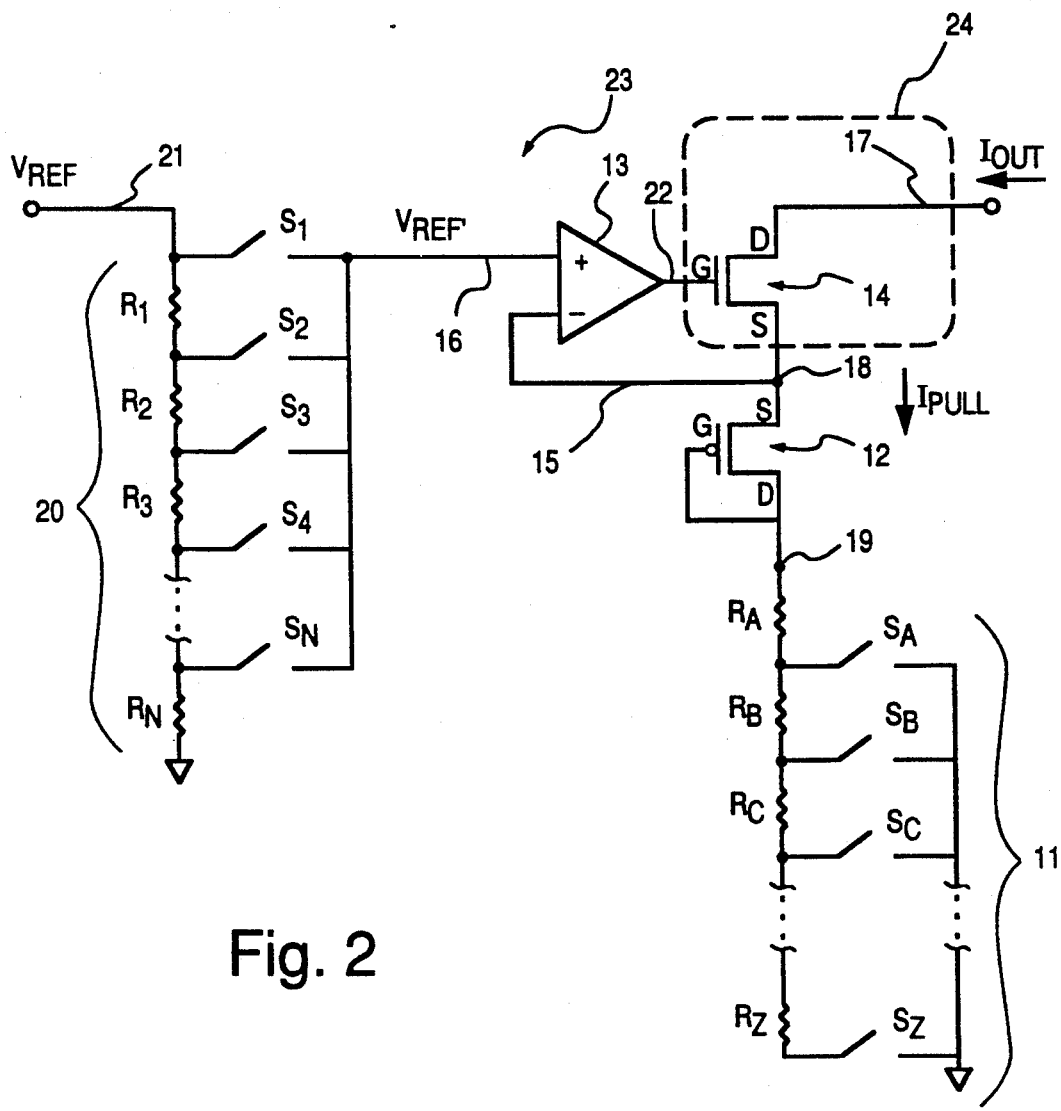
FIG. 2 illustrates a schematic of an actual embodiment of a temperature compensated voltage to current converter in accordance with the present invention which is also tunable.
Figure 3:
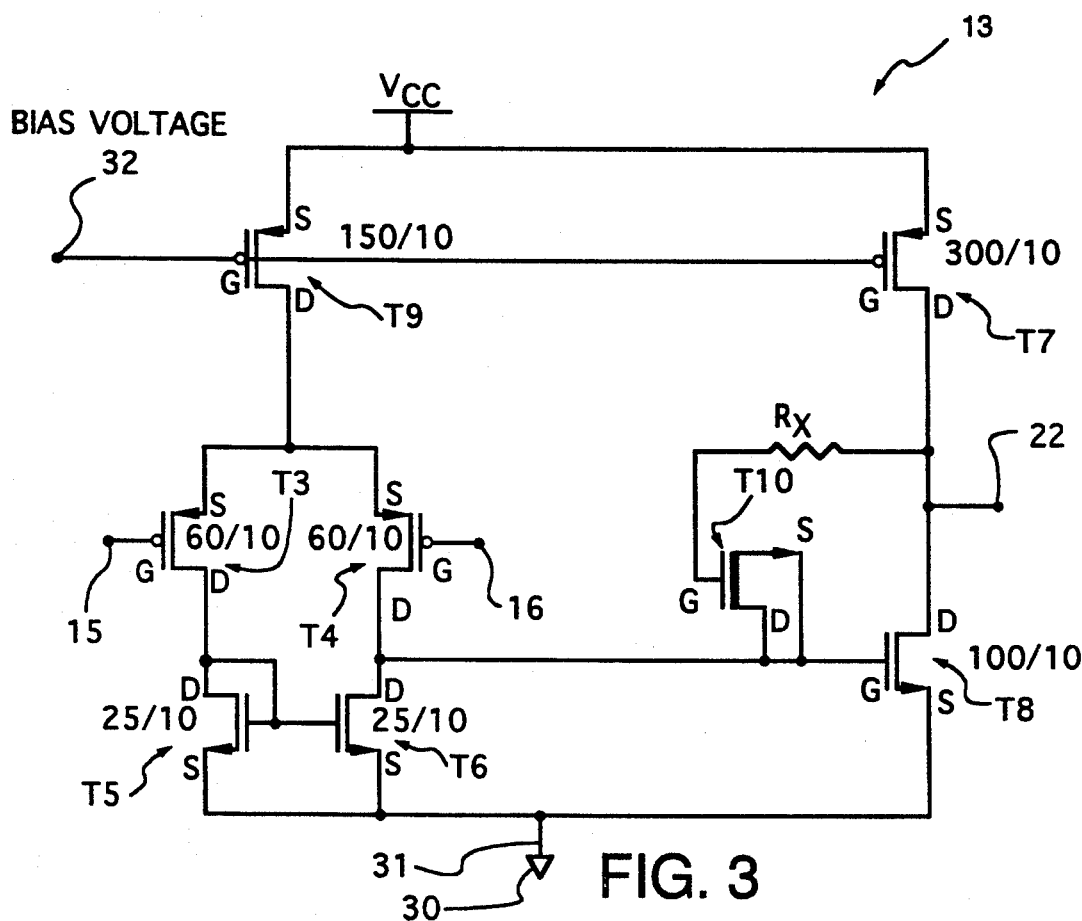
FIG. 3 shows one embodiment of an operational amplifier which is used in the present invention.

The operational amplifier 13, shown in FIG. 2, may be implemented using a circuit as set forth in FIG. 3 which illustrates the schematic of an operational amplifier 13 preferable for use with the present invention. Negative input terminal line 15 of operational amplifier 13 is connected to the gate of P-channel transistor T3, while the positive input terminal line 16 is connected to the gate of P-channel transistor T4. The input circuit of operational amplifier 13 further includes N-channel transistor T5 and N-channel transistor T6 which are connected to P-channel transistors T3 and T4, respectively. The source terminals of transistors T5 and T6 are connected to a power supply terminal 30 via conductor 31. The output circuit for operational amplifier 13 includes P-channel transistor T7 and N-channel transistor T8, with the output terminal 22 being connected to the commonly connected drains of transistors T7 and T8. A suitable bias voltage from a source (not shown) is applied to terminal 32 which is connected to the gates of P-channel transistors T7 and T9. The source terminals of transistors T7 and T9 are commonly connected, to positive supply voltage $V_{CC}$. The output circuit for operational amplifier 13 includes a frequency stabilization network comprised of resistor Rx and depletion mode transistor T10. As is well known to those skilled in the art, a depletion mode transistor with commonly connected source and drain (as shown for T10), functions as a capacitor. Resistor Rx couples the gate of transistor T10 to the commonly connected drains of transistors T7 and T8. The channel width to length ratio which is preferred for the transistors in operational amplifier 13 are indicated adjacent to each of the transistors. Operational amplifier 13 operates in a fashion well known to those skilled in the art and the explanation of its operation is accordingly not necessary.

Figure 5:
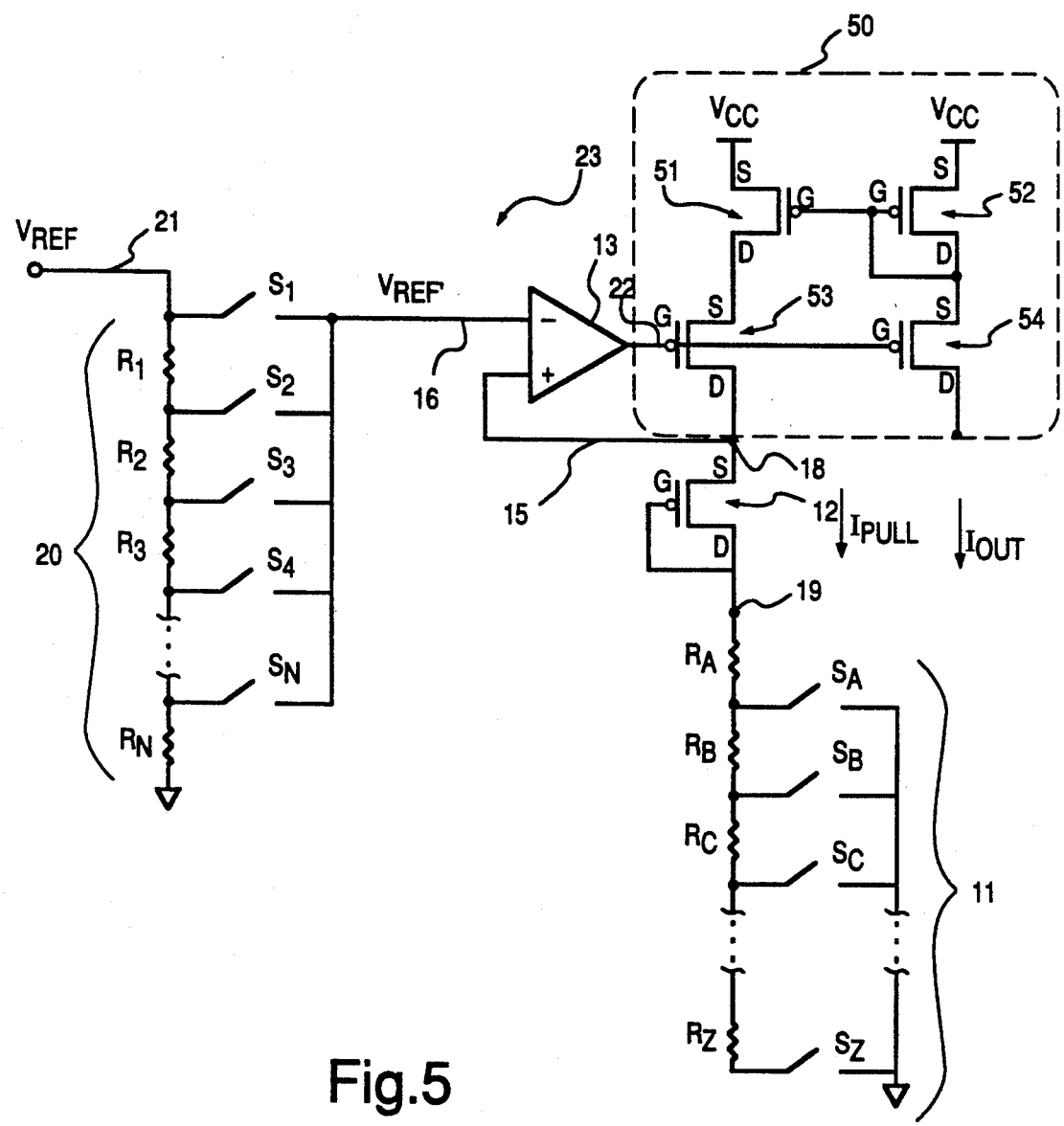
FIG. 5 shows a schematic of another actual embodiment of a converter which provides sourcing current instead of sinking current.

FIG. 2 illustrates the output line 22 of operational amplifier 13 connected to the control gate G of N-channel transistor 14. In this manner, transistor 14 responds to a control voltage by sourcing a current ($I_{PULL}$) into transistor 12 and the impedance network 11 connected between node 18 and ground which provides a predetermined voltage on node 18 (which will later be described in detail). In an alternative embodiment, a P-channel transistor network 50, as shown in FIG. 5, replaces N-channel transistor 14 which is part of network 24 (see FIG. 2). Transistor network 50, a P-channel current mirror, comprises P-channel transistors 51, 52, 53, and 54. As shown in FIG. 5, the gates G of transistors 51 and 52 are commonly connected, as are the gates G of transistors 53 and 54. The source S of transistors 51 and 52 are connected to voltage source $V_{CC}$, whereas drains D of transistors 51 and 52 are connected to the sources S of transistors 53 and 54. The drain of transistor 53 is coupled to node 18, whereas the drain of transistor 54 provides the output current $I_{OUT}$. The gate G of transistor 52 is shorted to its drain D. Note that in this configuration that line 15 which provides a feedback signal from node 18 to operational amplifier 13 is now connected to the positive input terminal, not the negative input terminal. In other words, N-channel transistor 14, shown in FIG. 2, provides a "current sink" which "pulls" the current. In contrast, the P-channel transistor network 50, shown in FIG. 5, provides a current source which "pushes" the current. Hence, depending upon which type of transistor is used, the appropriate input terminal to operational amplifier 13 is connected to feedback line 15. Operation of network 50 is well-known in the art and, therefore, is not described in detail.

Compensating For Processing Variations

Figure 1:
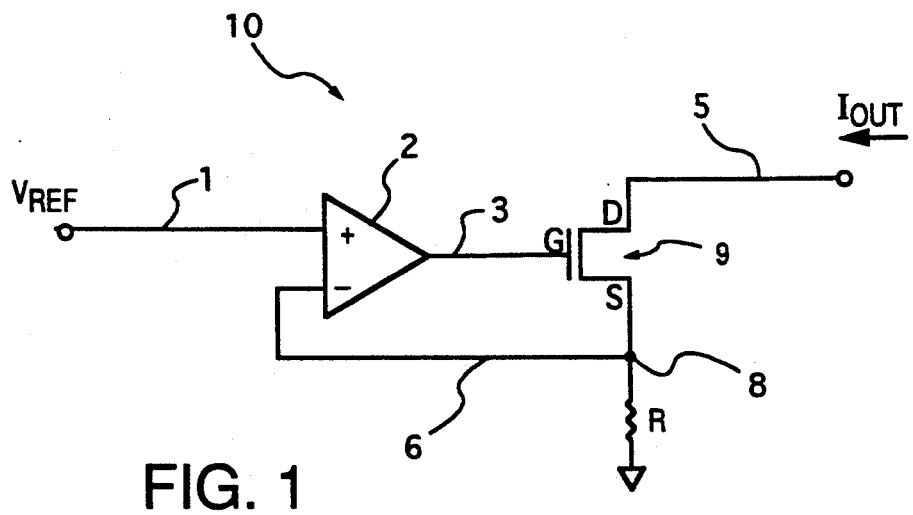
FIG. 1 shows a schematic of a simple circuit to accomplish voltage to current conversion which provides for buffering of a reference voltage.

To tune the magnitude of the resistance to account for processing, taps are programmed in impedance network 11 as shown in FIG. 2 (which takes the place of resistor R in FIG. 1). Impedance network 11 includes series-connected, polysilicon resistors $R_A$, $R_B$, $R_C$ to $R_Z$ (where Z is the total number of resistors in the series). Resistors $R_B$, $R_C$ to $R_Z$ are programmably connected to ground by switches $S_A$, $S_B$ to $S_Z$, respectively (where Z is equal to the total number of switches in impedance network 11). In other words, the closed switch shorts the associated node in impedance network 11 to ground, thereby altering the total resistance between node 19 and ground. In one embodiment of the present invention, switching is accomplished using EEPROM cells to control the state of pass gates which act as switches $S_A$-$S_Z$.

Figure 4:
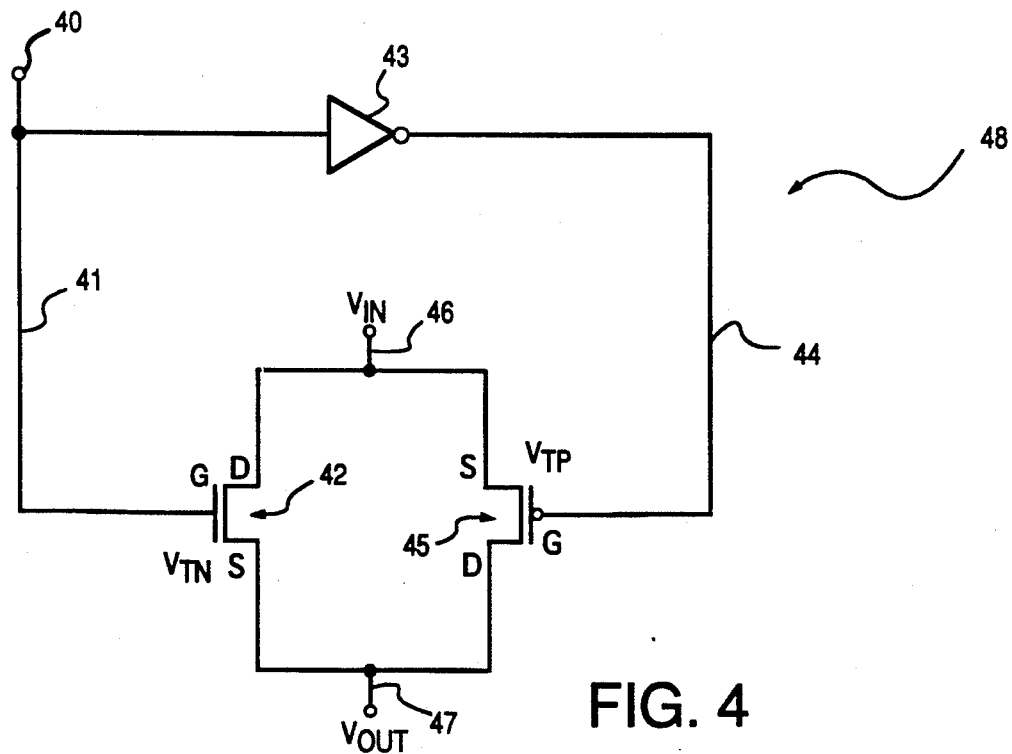
FIG. 4 illustrates a typical passgate used in the present invention.

FIG. 4 illustrates a typical pass gate 48 well-known in the art. A control signal provided on node 40, is applied to the gate G of n-channel transistor 42 via line 41. Inverter 43 inverts this signal, and transfers the new signal to the gate G of transistor 45 via line 44. This configuration ensures that both transistors 42 and 45 are both "on" or both "off". If transistors 42 and 45 are "on", then the output voltage $V_{OUT}$ is equal to $V_{IN}$. On the other hand, if transistors 42 and 45 are "off", then $V_{OUT}$ is not driven by $V_{IN}$ (i.e. the switch becomes a high impedance). Because the particular configuration of impedance network 11 (See FIG. 2) has switches $S_A$-$S_Z$ switchably connected to ground (i.e. line 47 as shown in FIG. 4 is connected to ground), transistor 45 and inverter 43 are eliminated in the preferred embodiment. In other words, switches $S_A$-$S_Z$ would be implemented using N-channel transistors with their sources connected to ground.

Using EEPROM cells to control switches $S_A$-$S_Z$ enables the user to reprogram the impedance. Moreover, EEPROM cells do not require special processing to obtain good performance from a standard process. Other programmable elements used to control switches $S_A$-$S_Z$ include: erasable programmable read-only memory cells, static random access memory cells, polysilicon fuses, antifuses, or laser-trimmed elements. Note that the resistances of the pass gates that act as switches $S_A$-$S_Z$ are made negligible compared to the linear resistors $R_A$-$R_Z$. Furthermore, at most, one switch is closed at any one time.

Compensating for Temperature Coefficients

Referring back to FIG. 1, resistor R increases in value over a predetermined temperature range. Therefore, as shown in equation 1 below, in order to maintain a constant $I_{OUT}$, the corresponding reference voltage $V_{REF}$ must also increase over that same predetermined temperature range.

$$I_{OUT}(T) = V_{REF}(T)//R(T) \quad \text{(Eq. 1)}$$

In other words, in order to produce a current with a small temperature coefficient, the reference voltage $V_{REF}$ across the resistor R must have a positive temperature coefficient to cancel the positive temperature coefficient of resistor R.

One way to generate a reference voltage $V_{REF}$ with a positive temperature coefficient is to subtract a voltage with a negative temperature coefficient from a constant voltage. The threshold voltage of an enhancement transistor has such a negative temperature coefficient. Therefore, as seen in FIG. 2, P-channel transistor 12 (the enhancement transistor) is coupled between the negative input terminal of operational amplifier 13 via line 15 and impedance network 11.

Connecting the gate G of transistor 12 to its drain D produces the following voltage relationship:

$$V_{DS} = V_{GS} \quad \text{(Eq. 2)}$$

where $V_{DS}$ is the drain to source voltage and $V_{GS}$ is the gate to source voltage.

However, the objective of the particular configuration of transistor 12 is to have $V_{GS}$ equal to its threshold voltage $V_{TP}$, i.e. to have transistor 12 barely "on". In this manner, the voltage across transistor 12, $V_{DS}$, equals threshold voltage $V_{TP}$. The following equation for drain to source current, $I_{DS}$, holds true for a transistor in saturation:

$$I_{DS} = \left(\frac{\mu C_{ox}}{2}\right)\left(\frac{W}{L}\right)(V_{GS} - V_{TP})^2 \qquad \text{(Eq. 3)}$$

where $\mu$ is a constant representing hole and election mobility, $C_{OX}$ is a constant of the gate oxide capacitance per unit area, and W/L is the width to length ratio of transistor 12.

Solving for $V_{GS}$ yields the equation:

$$V_{GS} = \sqrt{\left(\frac{1}{\mu C_{ox}}\right)\left(\frac{I_{DS}L}{W}\right)} + V_{TP} \qquad \text{(Eq. 4)}$$

In this manner, it is clear that voltage $V_{GS}$ will be approximately equal to threshold voltage $V_{TP}$ if the square root term is small with respect to voltage $V_{TP}$. However, because $\mu$ and $C_{OX}$ are constants, only the current $I_{DS}$, the length L of transistor 12, and the width W of transistor 12 can be varied. The preferred method of minimizing these variables is to provide a large W/L for transistor 12 with a small current $I_{DS}$. In one embodiment, the width and length ratio of transistor 12 is 800/4. A reasonable benchmark target for the product of these terms is given below.

$$\frac{I_{DS}L}{W} \approx 100 \times 10^{-9} A \qquad \text{(Eq. 5)}$$

Under the above conditions, node 19 has a voltage $V_{TUNE}$ equal to the reference voltage $V_{REF}$ (note similarity of node 18 in FIG. 2 to node 8 in FIG. 1) plus the threshold voltage of P-channel transistor 12.

$$V_{TUNE} = V_{REF'} + V_{TP} \qquad \text{(Eq. 6)}$$

In this manner, the effect of the temperature coefficient of impedance network 11 is minimized.

For further appreciation of the voltages appearing in various nodes in the circuit of FIG. 2, the following table is provided in which the left hand column indicates the baseline threshold voltages for P-channel devices and polycrystalline silicon resistance; and the right hand column indicates the corresponding temperature coefficients for both elements in the left hand column.

|          | Typical Absolute Values | Approximate Temperature Coefficients |
|----------|-------------------------|--------------------------------------|
| Poly R   | 25 ohms/□               | +0.00085 parts/C°                    |
| $V_{TP}$ | −0.9 V                  | −0.0016666 parts/C°                  |

To tune the temperature coefficient of the circuit to zero, the magnitude of the reference voltage $V_{REF}$ must also be adjusted using impedance network 20 as illustrated in FIG. 2. Impedance network 20 comprises n-well series connected resistors $R_1$-$R_N$, (where N is the total number of switches in impedance network 20) switchably connected to line 16. Switches $S_1$-$S_N$, like $S_A$-$S_Z$, are implemented using pass gates (see FIG. 4). Moreover, note that current $I_{OUT}$ will be determined now by the following elements: the reference voltage $V_{REF}$ as it is modified by impedance network 20; the threshold voltage $V_{TP}$ of transistor 12 which varies as a function of temperature; and a resistance provided by impedance network 11 which also varies as a function of temperature.

The magnitude of the current, $I_{OUT}$, including the effects of temperature coefficient cancellation, is expressed in Equation 8 below, $$I_{OUT} = \frac{K_1 V_{REF} + V_{TP}(1 + \alpha_1 T)}{K_2 R_{REF}(1 + \alpha_2 T)} \qquad \text{(Eq. 7)}$$

where $K_1$ is the ratio of the reference voltage $V_{REF}$. For example, if switch $S_2$ of impedance network 20 were programmed closed, the following equation would represent $K_1$:

$$K_1 = \frac{R_2 + R_3 + \ldots R_N}{R_1 + R_2 + \ldots R_N} \qquad \text{(Eq. 8)}$$

Two items should be noted at this time. First, $K_1$ will always be less than or equal to 1. Second, $$V_{REF'} = K_1 V_{REF} \qquad \text{(Eq. 9)}$$

Also referring to Equation 7, $R_{REF}$ is equivalent to all resistors included in impedance 11. Hence, $$R_{REF} = R_A + R_B + \ldots R_Z \qquad \text{(Eq. 10)}$$

Constant $K_2$, like $K_1$, is determined as a function of which of the switches $S_A$-$S_Z$ are programmed closed. Therefore, assuming for example that switch $S_B$ is closed, constant $K_2$ is represented by the equation below:

$$K_2 = \frac{R_A + R_B}{R_{REF}} \qquad \text{(Eq. 11)}$$

Note that constant $K_2$, like constant $K_1$, is also always less than or equal to 1.

In further reference to Equation 7, $\alpha_1$ is the temperature coefficient of the p-channel transistor threshold voltage $V_{TP}$, and $\alpha_2$ is the temperature coefficient of $R_{REF}$.

Using the value of $V_{TUNE}$ (as redefined below)

$$V_{TUNE} = V_{REF'} + V_{TP} = K_1 V_{REF} + V_{TP} \qquad \text{(Eq. 12)}$$

and defining the term $\beta$ as:

$$\beta = \alpha_1 T_P / V_{TUNE} \qquad \text{(Eq. 13)}$$

allows Equation 7 to be rewritten as:

$$I_{OUT} = \frac{V_{TUNE}(1 + \beta T)}{K_2 R_{REF}(1 + \alpha_2 T)} \qquad \text{(Eq. 14)}$$

As can be seen from the equation above, when $\beta$ equals $\alpha_2$, current $I_{OUT}$ has a zero temperature coefficient.

If $\beta = \alpha_2$, then using equation 13 yields the equation:

$$\frac{\alpha_1 V_{TP}}{V_{TUNE}} = \alpha_2 \qquad \text{(Eq. 15)}$$

Solving for $V_{TUNE}$ and using equation 12 yields:

$$\frac{\alpha_1 V_{TP}}{\alpha_2} = V_{TUNE} = K_1 V_{REF} + V_{TP} \quad \text{(Eq. 16)}$$

Solving for $K_1 V_{REF}$ yields:

$$\frac{\alpha_1 V_{TP}}{\alpha_2} - V_{TP} = K_1 V_{REF} \text{ or} \quad \text{(Eq. 17)}$$

$$\left(1 - \frac{\alpha_1}{\alpha_2}\right)(-V_{TP}) = K_1 V_{REF} \quad \text{(Eq. 18)}$$

Typical values are as follows: $V_{TP} = -0.8$, $\alpha_1 = -0.00166$, and $\alpha_2 = 0.00085$. Using equation 18, yields a $K_1 V_{REF}$ equal to 2.4 V (which is equal to $V_{REF}'$).

Hence, as demonstrated above, constant $K_1$ is used to adjust reference voltage $V_{REF}'$ to achieve a zero temperature coefficient. Constant $K_2$, on the other hand, is used to adjust the magnitude of the output current $I_{OUT}$ in accordance with the equation below.

$$I_{OUT} = \frac{K_1 V_{REF} + V_{TP}}{K_2 R_{REF}} \quad \text{(Eq. 19)}$$

Note that in temperature coefficient cancellation that all components are assumed to have only first order temperature coefficients. Measurements from silicon indicate that polysilicon resistors, such as $R_A$-$R_Z$, have linear temperature coefficients. Equation 7 shows that $K_1$ adjusts the magnitude of the current as well as the temperature coefficient, so $K_1$ must be adjusted first, then $K_2$ can calibrate the current to the desired value. Note that all elements having temperature coefficients should be tested at two temperatures, high and low, both before and after packaging (generally one temperature during wafer sort, and the other temperature during final assembly test). With non-volatile memory, the results of the first temperature measurement can be written to memory, with for example EEPROM cells or any other programmable elements, and then read during the second temperature test. Because of the above mentioned linear relationships, a line drawn between the two points determined by these two temperatures yields the temperature coefficient. After the temperature coefficient is tuned, the magnitude can be adjusted in one step, since the magnitude adjust ($K_2$) should have almost no effect on the overall temperature coefficient.

Hence, circuit 21 provides a constant current $I_{OUT}$ which is independent of temperature. This independence is accomplished by impedance network 20 and by P-channel transistor 12 which compensates for the temperature coefficient of impedance network 11. Furthermore, impedance network 11 allows circuit 21 to tune the magnitude of current $I_{OUT}$. As an additional benefit, impedance network 11 permits circuit 21 to be also independent of process.

A CMOS voltage to current converter in accordance with the present invention provides the following advantages:

1. The circuit does not require the use of bipolar transistors.
2. Further, the circuit does not require the use of a resistor with a low temperature coefficient. Instead, the temperature coefficient of an on-chip resistance is canceled by a threshold voltage temperature coefficient of a transistor.
3. The magnitude of the current is adjustable, and does not affect the temperature coefficient.
4. The circuit can be used with an external voltage source because the input reference voltage does not require a temperature coefficient.

The above description is meant to be illustrative only, and not limiting. For example, although polysilicon resistors were used in the above embodiment of the invention, other types of devices producing impedance may also be used. Furthermore, P-channel transistor 12 may be replaced with an N-channel device or other device with a suitable temperature coefficient. Further modifications of the invention will be apparent to one of ordinary skill in the art in light of this disclosure and the claims.

I claim:

1. An integrated circuit for converting a first temperature-independent reference voltage to comprising:
   means for receiving said first reference voltage and outputting a variable modified reference voltage;
   means for responding to a difference between a first voltage and a second voltage, and outputting at least one reference current, said first voltage being said modified reference voltage one of said at least one reference current being said temperature independent current;
   means for providing aid second voltage coupled to and receiving a first reference current of said at least one reference current, said means for providing said second voltage further coupled to a second reference voltage, said means for providing said second voltage comprising:
   means for providing a voltage offset coupled to and receiving said first reference current of said at least one reference current, wherein a magnitude of said voltage offset is substantially independent of a magnitude of said first reference current over a predetermined range of current; and
   means for providing resistance coupled to said means for providing a voltage offset, said means for providing a resistance further coupled to said second reference voltage;
   wherein said means for providing a voltage offset exhibits a temperature coefficient of voltage and said means for providing a resistance exhibits a temperature coefficient of resistance, wherein said temperature coefficient of voltage is independent from said temperature coefficient of resistance;
   wherein said means for responding to a difference between a first voltage and a second voltage outputs sufficient current to drive said second voltage to be substantially equal to said first voltage independent of the value of said voltage offset and the value of said resistance.

2. The circuit of claim 1 wherein said means for receiving provides a linear relationship between said first reference voltage and said modified reference voltage.

3. The circuit of claim 2 wherein said means for receiving provides a constant relationship between a temperature coefficient of voltage of said first reference voltage and a temperature coefficient of voltage of said modified reference voltage, wherein said temperature coefficients of said voltages are substantially equal.

4. The circuit of claim 3 wherein said means for varying comprises a tapped resistor voltage divider network with at least one tap and means for selectively outputting said modified reference voltage.

5. The circuit of claim 4 wherein said means for selectively outputting comprises a switch for each of said at least one tap.

6. The circuit of claim 5 wherein said switch is a CMOS transistor pass gate.

7. The circuit of claim 5 wherein said tapped resistor voltage divider network further includes at least one programmable cell, said switch being responsive to said at least one programmable cell.

8. The circuit of claim 7 wherein said programmable cell is an electrically erasable programmable read only memory (EEPROM) cell.

9. The circuit of claim 7 wherein said programmable cell is a static random access memory (SRAM) cell.

10. The circuit of claim 7 wherein said programmable cell is an erasable programmable read only memory (EPROM) cell.

11. The circuit of claim 7 wherein said programmable cell is a polysilicon fuse.

12. The circuit of claim 7 wherein said programmable cell is an anti-fuse.

13. The circuit of claim 7 wherein said programmable cell comprises a laser-programmable link.

14. The circuit of clam 1 wherein said means for responding comprises:
(a) means for comparing said first and second voltages and providing a third voltage responsive to said difference between said first and second voltages; and
(b) means responsive to said third voltage to provide said at least one reference current.

15. The circuit of claim 14 wherein (a) is an operational amplifier.

16. The circuit of claim 14 wherein (b) comprises an MOS transistor having a gate, a source, and a drain, said gate connected to said third voltage, said first reference current of said at least one reference current flowing between said source and said drain.

17. The circuit of claim 16 wherein said MOS transistor is an N-channel enhancement device.

18. The circuit of claim 14 further comprising at least a second reference current and a third reference voltage,
wherein (b) is an MOS transistor network comprising a plurality of P-channel enhancement devices,
wherein said plurality of P-channel enhancement devices are in a current mirror configuration including at least four P-channel transistors, each transistor having a drain, a source, and a gate,
wherein said drain of said first P-channel transistor is connected to said source of said second P-channel transistor and said source of said first P-channel transistor is connected to said third reference voltage,
wherein said drain of said third P-channel transistor is connected to said source of said fourth P-channel transistor and said source of said third P-channel transistor is connected to said third reference voltage,
wherein said gates of said first and third P-channel transistors are connected, and said gates of said second and fourth P-channel transistors are connected,
wherein said gate and said drain of said third P-channel transistor are connected,
wherein said gate of said second P-channel transistor is connected to said third voltage,
wherein said first and second P-channel transistors form a first branch, and said third and fourth P-channel transistors form a second branch,
wherein aid first reference current flows in said first branch, and said second reference current flows in said second branch.

19. The circuit of claim 1 wherein said means for providing a voltage offset comprises an MOS transistor having a gate, a source, and a drain, said gate being connected to said drain.

20. The circuit of claim 19 wherein said MOS transistor is an N-channel enhancement device.

21. The circuit of claim 19 wherein said MOS transistor is a P-channel enhancement device.

22. The circuit of claim 1 wherein said means for providing a resistance comprises means for varying the value of said resistance.

23. The circuit of claim 22 wherein said means for varying the value of said resistance comprises a laser-trimmed element.

24. The circuit of claim 22 wherein said means for varying the value of said resistance comprises a tapped resistor network with at least one tap and means for selectively coupling said tap to said second reference voltage.

25. The circuit of claim 24 wherein said means for selectively coupling comprises a switch for each of said at least one tap.

26. The circuit of claim 25 wherein said switch is an MOS transistor pass gate.

27. The circuit of claim 25 wherein said tapped resister network further includes at least one programmable cell, said switch being responsive to said at least one programmable cell.

28. The circuit of claim 27 wherein said programmable cell is an electrically erasable programmable read only memory (EEPROM) cell.

29. The circuit of claim 27 wherein said programmable cell is a static random access memory (SRAM) cell.

30. The circuit of claim 27 wherein said programmable cell is an erasable programmable read only memory (EPROM) cell.

31. The circuit of claim 27 wherein said programmable cell comprises a laser-programmable link.

32. The circuit of claim 27 wherein said programmable cell is a polysilicon fuse.

33. The circuit of claim 27 wherein said programmable cell is an anti-fuse.

34. A method for converting a temperature-independent, constant voltage to a temperature-independent current comprising the steps of:
inputting said temperature-independent, constant voltage to a circuit;
outputting from said circuit a temperature-dependent variable voltage having a first predetermined temperature coefficient of voltage across a resistance having a second predetermined temperature coefficient of resistance, wherein the magnitude of said temperature-dependent variable voltage is substantially independent of the magnitude of said resistance over a predetermined range of resistance values; and·
varying a magnitude of said temperature-dependent variable voltage by varying a means for varying a voltage which receives said temperature-independent constant voltage until said first predetermined temperature coefficient of voltage compensates for said second predetermined temperature coefficient of resistance to provide said temperature-independent current.

35. The method of claim 34 wherein outputting said temperature-dependent variable voltage includes the steps of:
   (a) producing a first input voltage by adjusting said means for varying a voltage coupled to said temperature-independent, constant voltage;
   (b) producing a second input voltage across a series connected voltage offset stage and said resistance in response to a first reference current, said first reference current being said temperature-independent current, said voltage offset stage exhibiting a temperature-dependent voltage offset with substantially no dependents on said first reference current; and
   (c) providing said first reference current with a differential voltage to current converter in response to a difference between said first input voltage and said second input voltage, wherein said first reference current is sufficient to drive said second input voltage to be substantially equal to said first input voltage independent of the value of said voltage offset and the value of said resistance.

36. The method of claim 35 wherein said means for varying a voltage comprises a resistive voltage divider network having a controllable divide ratio.

37. The method of claim 36 wherein step (a) includes controlling said controllable divide ratio of said resistive voltage divider network with electrically programmable cells.

38. The method of claim 36 wherein step (a) includes controlling said controllable divide ratio of said resistive voltage divider network with laser programmable links.

39. The method of claim 36 wherein step (a) includes controlling said controllable divide ratio of said resistive voltage divider network by laser-trimming one or more resistor values.

40. The method of claim 35 wherein said means for varying a voltage comprises a voltage gain stage having a controllable gain factor.

41. The method of claim 40 wherein step (a) includes controlling said controllable gain factor of said voltage gain stage with electrically programmable cells.

42. The method of claim 40 wherein step (a) includes controlling said controllable gain factor of said voltage gain stage with laser programmable links.

43. The method of claim 40 wherein step (a) includes controlling said controllable gain factor of said voltage gain stage with a laser-trimmed element.

44. The method of claim 35 wherein said series connected voltage offset stage includes operating an MOS transistor at its turn-on threshold value.

45. The method of claim 34 further comprising the step of:
   adjusting the magnitude of said temperature-independent current by varying the value of said resistance.

46. The method of claim 45 wherein said step of adjusting includes controlling said value of said resistance with electrically programmable cells.

47. The method of claim 45 wherein said step of adjusting includes controlling said value of said resistance with laser programmable links.

48. The method of claim 45 wherein said step of adjusting includes controlling said value of said resistance by laser trimming.

* * * * *